(12) United States Patent
Khemka et al.

(10) Patent No.: US 7,309,638 B2
(45) Date of Patent: Dec. 18, 2007

(54) METHOD OF MANUFACTURING A SEMICONDUCTOR COMPONENT

(75) Inventors: Vishnu Khemka, Phoenix, AZ (US); Vijay Parthasarathy, Phoenix, AZ (US); Ronghua Zhu, Chandler, AZ (US); Amitava Bose, Tempe, AZ (US); Todd C. Roggenbauer, Chandler, AZ (US)

(73) Assignee: Freescale Semiconductor, Inc., Schaumburg, IL (US)

( * ) Notice: Subject to any disclaimer, the term of this patent is extended or adjusted under 35 U.S.C. 154(b) by 347 days.

(21) Appl. No.: 11/182,597

(22) Filed: Jul. 14, 2005

(65) Prior Publication Data

US 2006/0014342 A1    Jan. 19, 2006

Related U.S. Application Data

(62) Division of application No. 10/391,040, filed on Mar. 17, 2003, now Pat. No. 6,933,546.

(51) Int. Cl.
*H01L 21/20* (2006.01)
*H01L 21/00* (2006.01)

(52) U.S. Cl. ............... 438/380; 438/91; 438/983

(58) Field of Classification Search ........ 257/106, 257/186, 199, 481–482, 493, 589, 603–606, 257/E31.063, E29.334–E29.335, E21.354, 257/E21.355, E21.356, E21.357; 438/91, 438/380, 983, 328

See application file for complete search history.

(56) References Cited

U.S. PATENT DOCUMENTS

| 3,466,512 | A | * | 9/1969 | Seidel ................. 257/199 |
| 3,959,646 | A | * | 5/1976 | DE Cremoux ......... 257/438 |
| 3,984,857 | A | * | 10/1976 | Mason ................ 257/106 |
| 4,599,631 | A | * | 7/1986 | Tsuzuki ............... 257/551 |
| 5,917,227 | A | * | 6/1999 | Ogihara et al. ....... 257/443 |
| 6,573,528 | B2 | * | 6/2003 | Braddock ............. 257/14 |
| 7,170,112 | B2 | * | 1/2007 | Ning .................. 257/197 |
| 2003/0183855 | A1 | * | 10/2003 | Dries et al. ........... 257/200 |
| 2003/0189220 | A1 | * | 10/2003 | Hamerski ............. 257/200 |

* cited by examiner

*Primary Examiner*—Mary Wilczewski
*Assistant Examiner*—Swapneel Chhaya
(74) *Attorney, Agent, or Firm*—Bryan Cave LLP

(57) ABSTRACT

A semiconductor component comprises a first semiconductor region (110, 310), a second semiconductor region (120, 320) above the first semiconductor region, a third semiconductor region (130, 330) above the second semiconductor region, a fourth semiconductor region (140, 340) above the third semiconductor region, a fifth semiconductor region (150, 350) above the second semiconductor region and at least partially contiguous with the fourth semiconductor region, a sixth semiconductor region (160, 360) above and electrically shorted to the fifth semiconductor region, and an electrically insulating layer (180, 380) above the fourth semiconductor region and the fifth semiconductor region. A junction (145, 345) between the fourth semiconductor region and the fifth semiconductor region forms a zener diode junction, which is located only underneath the electrically insulating layer. In one embodiment, a seventh semiconductor region (170) circumscribes the third, fourth, fifth, and sixth semiconductor regions.

10 Claims, 8 Drawing Sheets

METHOD OF MANUFACTURING A SEMICONDUCTOR COMPONENT

This application is a divisional application of prior application Ser. No. 10/391,040, filed Mar. 17, 2003 now U.S. Pat. No. 6,933,546.

FIELD OF THE INVENTION

This invention relates generally to semiconductor components, and relates more particularly to zener diodes and methods of manufacture.

BACKGROUND OF THE INVENTION

Zener diodes are some of the most extensively-used components in semiconductor technology, being used for a wide variety of applications, including voltage regulation and protection from electrostatic discharge events. Two different kinds of breakdown current may affect the operation of a diode at breakdown: impact ionization, or avalanche, breakdown current, and tunneling, or zener, breakdown current. The term "zener diode," as it is classically used, and as it will be used herein, refers to a diode that is being operated in reverse bias where both tunneling breakdown and avalanche breakdown occur simultaneously. Given this classical definition, it is improper to use the term "zener diode" to refer to a diode with a breakdown voltage above approximately six volts, because such a diode does not experience tunneling effects, as will be further explained below. Impact ionization breakdown current has a positive temperature coefficient, meaning the breakdown voltage increases with temperature. Tunneling current has a negative temperature coefficient, meaning the breakdown voltage decreases with temperature. Diodes having breakdown voltages below approximately five volts are dominated by tunneling breakdown current, while diodes having breakdown voltages above approximately six volts are dominated by impact ionization breakdown current. Diodes having breakdown voltages between approximately five and six volts simultaneously experience both tunneling breakdown current and impact ionization breakdown current, and the temperature coefficients of the impact ionization breakdown current and the tunneling breakdown current tend to cancel each other out. This cancellation effect produces a diode with a breakdown voltage that is relatively insensitive to temperature.

In power integrated circuit (IC) technology, conventional manufacturing techniques typically require that zener diode junctions be placed under field oxide regions. When a diode is biased into breakdown, the many energetic (hot) carriers that are generated may be injected into the overlying oxide region, thereby modifying the electric field profile of the diode junction, which in turn changes the breakdown voltage of the diode. In this way, the voltage clamp of a zener diode can move, or drift, over time. In some applications, such as gate to source voltage clamping, voltage clamping for electrostatic discharge (ESD) protection, and clamped inductive switching of power devices, such drifting of the zener voltage clamp can be problematic. Some of the above-mentioned applications require a voltage clamp that is constant to within approximately 10 milliamps.

A zener diode formed by adjacent, heavily-doped (approximately $1 \times 10^{20}$ atoms per centimeter cubed) shallow semiconductor regions typically constitutes a very leaky diode that, according to the classical definition given above, is not even a true zener diode because it has a breakdown voltage of approximately three to four volts. The implantation steps used to form the P and N regions of such a diode mechanically damage the silicon at the zener diode junction between the P and N regions to the point where the performance of the diode is compromised. The increasing use of silicidation in power IC technology further complicates the formation of zener diodes because the silicide tends to short the zener diode junction. Furthermore, if zener diodes are to be stacked in series for voltage clamping purposes, the zener diodes must be isolated. Such isolation can consume a lot of space. Accordingly, there is a need for a self-isolating zener diode with a junction that may be formed in an active area and that is compatible with silicide technology.

BRIEF DESCRIPTION OF THE DRAWINGS

The invention will be better understood from a reading of the following detailed description, taken in conjunction with the accompanying figures in the drawings in which.

Figure 1:
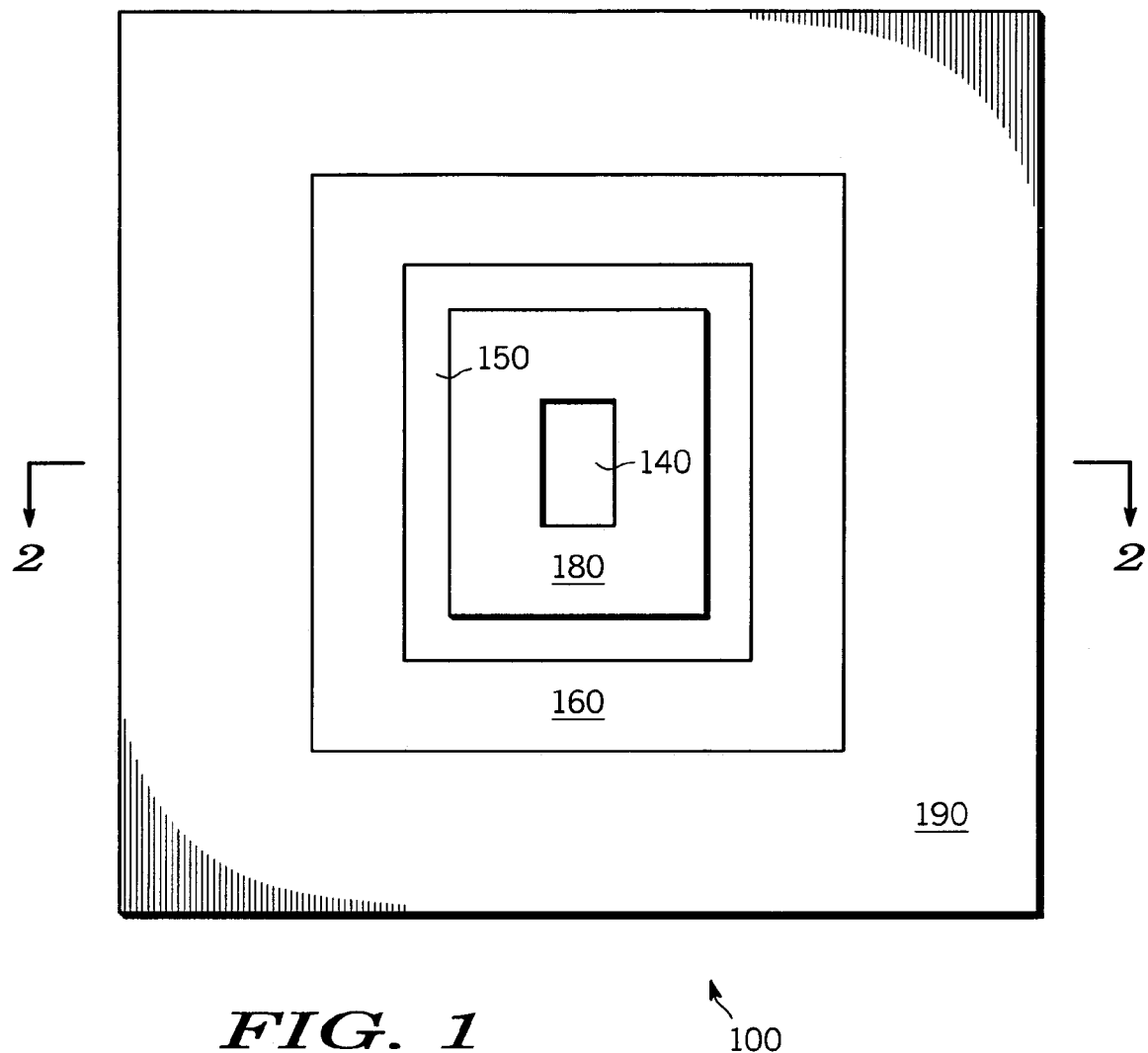
FIG. 1 is a top view of a portion of a semiconductor component according to an embodiment of the invention.

For simplicity and clarity of illustration, the drawing figures illustrate the general manner of construction, and descriptions and details of well-known features and techniques may be omitted to avoid unnecessarily obscuring the invention. Additionally, elements in the drawing figures are not necessarily drawn to scale. For example, the dimensions of some of the elements in the figures may be exaggerated relative to other elements to help improve understanding of embodiments of the present invention. The same reference numerals in different figures denote the same elements.

The terms "first," "second," "third," "fourth," and the like in the description and in the claims, if any, are used for distinguishing between similar elements and not necessarily for describing a particular sequential or chronological order. It is to be understood that the terms so used are interchangeable under appropriate circumstances such that the embodiments of the invention described herein are, for example, capable of operation in sequences other than those illustrated or otherwise described herein. Furthermore, the terms "comprise," "include," "have," and any variations thereof, are intended to cover a non-exclusive inclusion, such that a process, method, article, or apparatus that comprises a list of elements is not necessarily limited to those elements, but may include other elements not expressly listed or inherent to such process, method, article, or apparatus.

The terms "left," "right," "front," "back," "top," "bottom," "over," "under," and the like in the description and in the claims, if any, are used for descriptive purposes and not necessarily for describing permanent relative positions. It is to be understood that the terms so used are interchangeable under appropriate circumstances such that the embodiments of the invention described herein are, for example, capable of operation in other orientations than those illustrated or otherwise described herein. The term "coupled," as used herein, is defined as directly or indirectly connected in an electrical or non-electrical manner.

DETAILED DESCRIPTION OF THE DRAWINGS

In one embodiment of the invention, a semiconductor component comprises a first semiconductor region having a first conductivity type, a second semiconductor region having a second conductivity type located above the first semiconductor region, a third semiconductor region located above the second semiconductor region, a fourth semiconductor region located above the third semiconductor region and having a conductivity type, a fifth semiconductor region having a conductivity type different from the conductivity type of the fourth semiconductor region and located above the second semiconductor region and at least partially contiguous with the fourth semiconductor region, a sixth semiconductor region having the conductivity type of the fifth semiconductor region and located above and electrically shorted to the fifth semiconductor region, a seventh semiconductor region having the second conductivity type, at least partially contiguous with the second semiconductor region, and circumscribing the third semiconductor region, the fourth semiconductor region, the fifth semiconductor region, and the sixth semiconductor region, and an electrically insulating layer above the fourth semiconductor region and the fifth semiconductor region.

A junction between the fourth semiconductor region and the fifth semiconductor region forms a zener diode junction, which is located only underneath the electrically insulating layer. The fifth semiconductor region has a doping level lower than doping levels of the second semiconductor region, the fourth semiconductor region, the sixth semiconductor region, and the seventh semiconductor region, and the third semiconductor region has a doping level lower than the doping level of the fifth semiconductor region.

Figure 2:
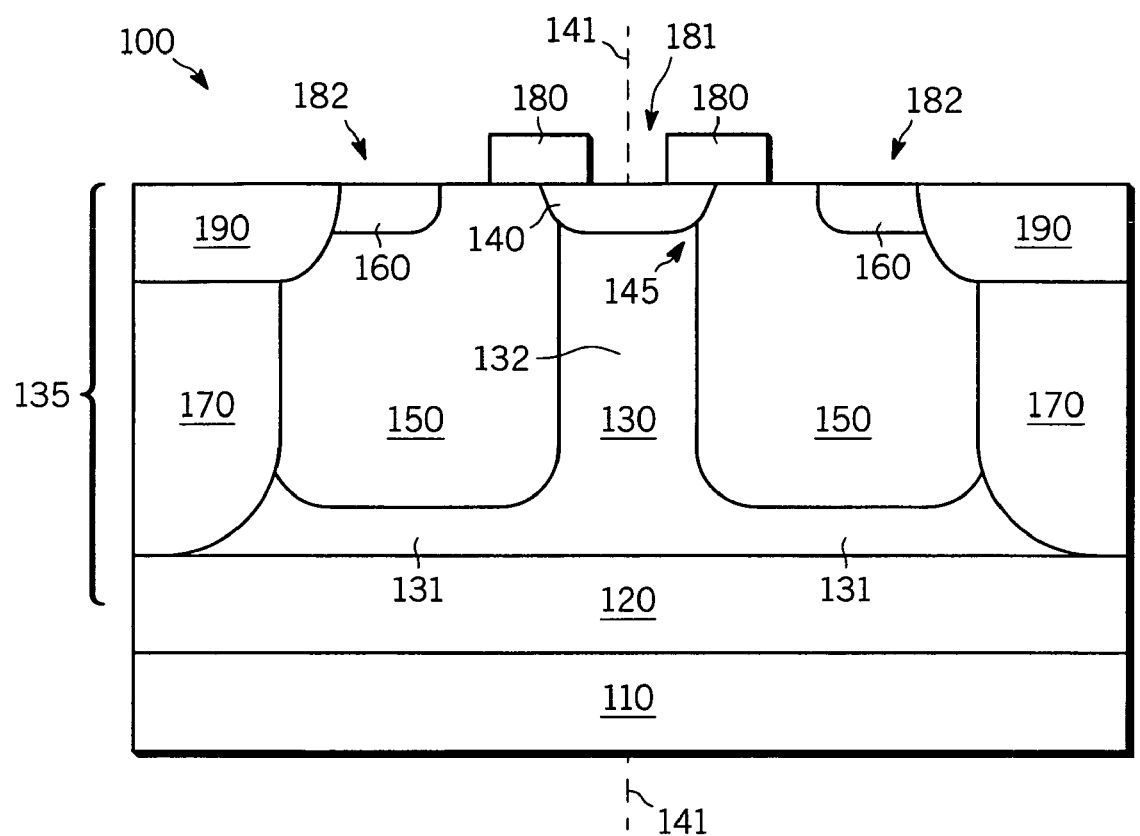
FIG. 2 is a cross-sectional view of the portion of the semiconductor component of FIG. 1 taken along a section line 2-2 in FIG. 1.

FIGS. 1 and 2 are top and cross-sectional views, respectively, of a portion of a semiconductor component according to an embodiment of the invention. Referring now to FIGS. 1 and 2, a semiconductor component 100 comprises a semiconductor region 110, a semiconductor region 120 located above semiconductor region 110, and a semiconductor region 130 located above and, in one embodiment, at least partially contiguous with semiconductor region 120.

Semiconductor component 100 may further comprise a semiconductor region 135. Semiconductor region 135 may comprise a semiconductor epitaxial layer, and semiconductor region 110 may comprise a semiconductor substrate. Semiconductor region 110 has a first conductivity type and semiconductor region 120, as originally formed, has a second conductivity type. Semiconductor region 130 is located in the semiconductor epitaxial layer and, in one embodiment, can be an original portion of the semiconductor epitaxial layer. In one embodiment, semiconductor region 120 can be located in both of the semiconductor epitaxial layer and the semiconductor substrate. The semiconductor epitaxial layer and the semiconductor substrate can be comprised of the same semiconductor material such as, for example, silicon or gallium arsenide, or can be comprised of different semiconductor materials.

Semiconductor component 100 further comprises a semiconductor region 140 located above and, in the illustrated embodiment, at least partially contiguous with semiconductor region 130, a semiconductor region 150 located above semiconductor region 120 and at least partially contiguous with semiconductor region 140, a semiconductor region 160 located above, electrically shorted to, and at least partially contiguous with semiconductor region 150, and a semiconductor region 170 at least partially contiguous with semiconductor region 120 and circumscribing semiconductor region 130, semiconductor region 140, semiconductor region 150, and semiconductor region 160. Semiconductor regions 140, 150, 160, and 170 are located in semiconductor region 135.

Semiconductor region 150 has a doping level lower than doping levels of semiconductor region 120, semiconductor region 140, semiconductor region 160, and semiconductor region 170. Semiconductor region 130 has a doping level lower than the doping level of semiconductor region 150. Semiconductor region 140 has a conductivity type. Semiconductor region 150 has a conductivity type different from the conductivity type of semiconductor region 140, while semiconductor region 160 has the conductivity type of semiconductor region 150. Semiconductor region 170 has the second conductivity type. In one embodiment, semiconductor region 140 has the first conductivity type, and semiconductor region 150 and semiconductor region 160 have the second conductivity type. In another embodiment, semiconductor region 140 has the second conductivity type, and semiconductor region 150 and semiconductor region 160 have the first conductivity type.

In one embodiment of semiconductor component 100, semiconductor region 150 and semiconductor region 160 circumscribe semiconductor region 140. In the same or another embodiment, semiconductor region 150 circumscribes a portion of semiconductor region 130. In the same or another embodiment, a portion 131 of semiconductor region 130 is located between semiconductor region 150 and semiconductor region 120, and a portion 132 of semiconductor region 130 is located between semiconductor region 140 and semiconductor region 120. In the same or another embodiment, semiconductor region 130, semiconductor region 140, semiconductor region 150, semiconductor region 160, and semiconductor region 170 are symmetric about a line 141 drawn through a geometric center of semiconductor region 140.

In a particular embodiment, semiconductor region 140 has a maximum junction depth in semiconductor region 135 of less than approximately 0.4 micrometers, which is less than a junction depth of semiconductor region 150 and semiconductor region 170 in semiconductor region 135. In the same or another embodiment, semiconductor region 140 has a doping concentration between approximately $5 \times 10^{19}$ and $1 \times 10^{20}$ atoms per cubic centimeter. In the same or another embodiment, semiconductor region 150 has a maximum junction depth less than the junction depth of semiconductor region 170. In the same or another embodiment, semiconductor region 150 has a doping concentration between approximately $1 \times 10^{18}$ and $5 \times 10^{19}$ atoms per cubic centimeter.

Semiconductor component 100 still further comprises an electrically insulating layer 180 above semiconductor region 140 and semiconductor region 150. As an example, electrically insulating layer 180 can comprise an oxide or a nitride. As another example, electrically insulating layer 180 can comprise an oxide/nitride stack. In one embodiment, not shown, electrically insulating layer 180 may also be located above semiconductor region 160.

Semiconductor region 140 and semiconductor region 150 form at least a portion of a zener diode. More particularly, a junction between semiconductor region 140 and semiconductor region 150 forms a zener diode junction 145, which is located only underneath electrically insulating layer 180, for reasons explained later. In at least one embodiment, zener diode junction 145 has a breakdown voltage of between approximately five and six volts. Semiconductor region 120 and semiconductor region 170 electrically isolate the zener diode from semiconductor region 110. Accordingly, the zener diode is self-isolating, and does not need additional isolation structures. The zener diode may be used in semiconductor component 100 to provide a voltage clamp or a reference voltage.

In one embodiment, semiconductor component 100 further comprises a region 181 and a region 182 separated from region 181. As an example, region 182 can be separated from region 181 by electrically insulating layer 180. As another example, a dopant forming semiconductor region 140 can be implanted into region 181, and a dopant forming semiconductor region 150 can be implanted into region 182. Implanting through regions 181 and 182 of semiconductor component 100 can help reduce the amount of damage that is sustained by the silicon underneath electrically insulating layer 180.

In one embodiment (not illustrated), semiconductor region 160 is self-aligned to electrically insulating layer 180. In the same or another embodiment, semiconductor regions 140 and 150 are self-aligned to electrically insulating layer 180. In the embodiment of FIGS. 1 and 2, semiconductor component 100 is insensitive to misalignment because of its symmetry.

Semiconductor component 100 further comprises an electrically insulating layer 190. In one embodiment, electrically insulating layer 190 is a field oxide layer. In another embodiment, electrically insulating layer 190 is a shallow trench insulator. In the illustrated embodiment, electrically insulating layer 190 is located over and is contiguous with semiconductor regions 150 and 170 and is also contiguous with semiconductor region 160. In one embodiment, semiconductor region 150 can be self-aligned between electrically insulating layer 190 and electrically insulating layer 180, and semiconductor region 160 can be self-aligned to electrically insulating layer 190. In another embodiment (not illustrated), both semiconductor region 150 and semiconductor region 160 can be self-aligned between electrically insulating layer 180 and electrically insulating layer 190.

Figure 3:
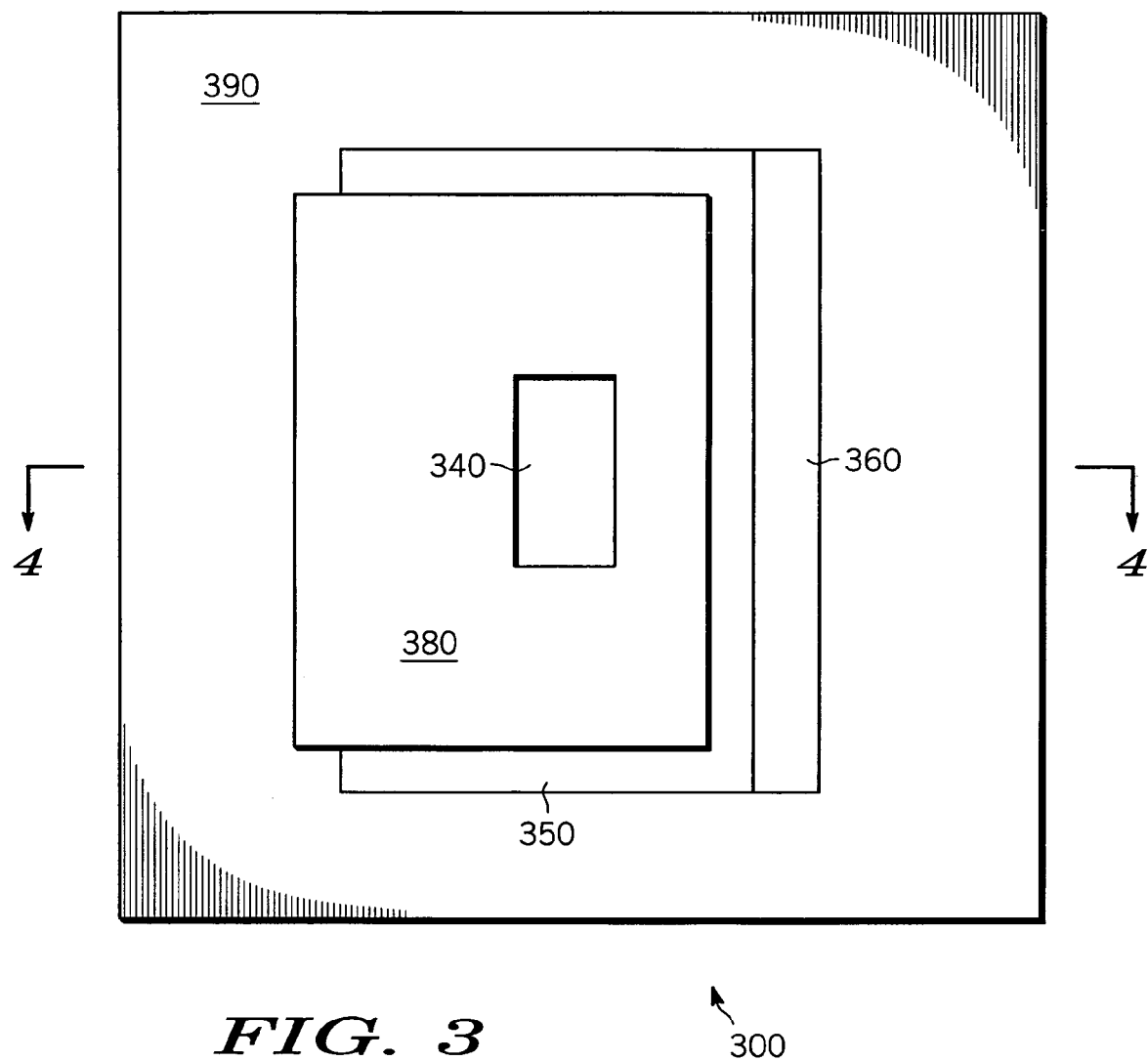
FIG. 3 is a top view of a portion of a semiconductor component according to another embodiment of the invention.
Figure 4:
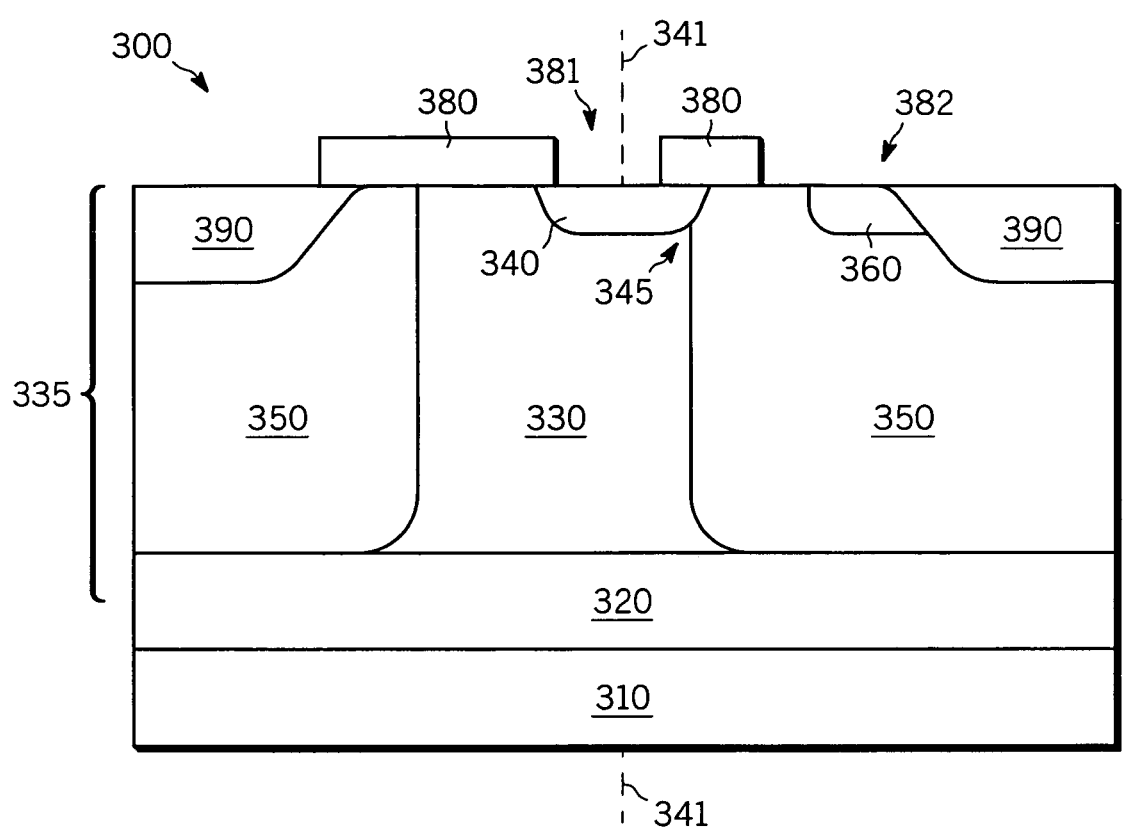
FIG. 4 is a cross-sectional view of the portion of the semiconductor component of FIG. 3 taken along a section line 4-4 in FIG. 3.

FIGS. 3 and 4 are top and cross-sectional views, respectively, of a portion of a semiconductor component according to another embodiment of the invention. Referring now to FIGS. 3 and 4, a semiconductor component 300 comprises a semiconductor region 310, a semiconductor region 320, and a semiconductor region 330. As an example, semiconductor regions 310 and 320 can be similar to semiconductor regions 110 and 120, respectively, in FIG. 2. Except with respect to portion 131, which has no counterpart in semiconductor region 330, semiconductor region 330 can be similar to semiconductor region 130 in FIG. 2. Semiconductor component 300 may further comprise a semiconductor region 335. As an example, semiconductor region 335 can be similar to semiconductor region 135 in FIG. 2.

Semiconductor component 300 further comprises a semiconductor region 340, a semiconductor region 350 located above semiconductor region 320 and at least partially contiguous with semiconductor region 340, and a semiconductor region 360 located above, electrically shorted to, and at least partially contiguous with semiconductor region 350. As an example, and except as noted below, semiconductor regions 340 and 360 can be similar to semiconductor regions 140 and 160, respectively, in FIGS. 1 and 2. As a further example, and except as noted below, semiconductor region 350 can be similar to semiconductor regions 150 and 170 in FIG. 2. Semiconductor region 340 has the first conductivity type, and semiconductor region 350 and semiconductor region 360 have the second conductivity type. Semiconductor region 350 is at least partially contiguous with semiconductor region 320, and semiconductor region 350 circumscribes semiconductor region 330 and semiconductor region 340. Semiconductor region 360 does not circumscribe semiconductor region 330 or semiconductor region 340.

Semiconductor component 300 still further comprises an electrically insulating layer 380 located above semiconductor region 330, semiconductor region 340, and semiconductor region 350. As an example, electrically insulating layer 380 can be similar to electrically insulating layer 180 in FIGS. 1 and 2.

Semiconductor region 340 and semiconductor region 350 form at least a portion of a zener diode. More particularly, a junction between semiconductor region 340 and semiconductor region 350 forms a zener diode junction 345, which is located only underneath electrically insulating layer 380. As an example, zener diode junction 345 can be similar to zener diode junction 145 in FIG. 2. The zener diode is asymmetric about a line 341 drawn through a geometric center of semiconductor region 340.

In one embodiment, semiconductor component 300 further comprises a region 381 and a region 382 separated from region 381. As an example, region 382 can be separated from region 381 by electrically insulating layer 380. As another example, a dopant forming semiconductor region 340 can be implanted into region 381, and a dopant forming semiconductor region 350 can be implanted into region 382. In one embodiment (not illustrated), semiconductor region 360 is self-aligned to electrically insulating layer 380. In the same or another embodiment, semiconductor region 340 is self-aligned to electrically insulating layer 380.

Semiconductor component 300 further comprises an electrically insulating layer 390. As an example, electrically insulating layer 390 can be similar to electrically insulating layer 190 in FIG. 2.

Figure 5:
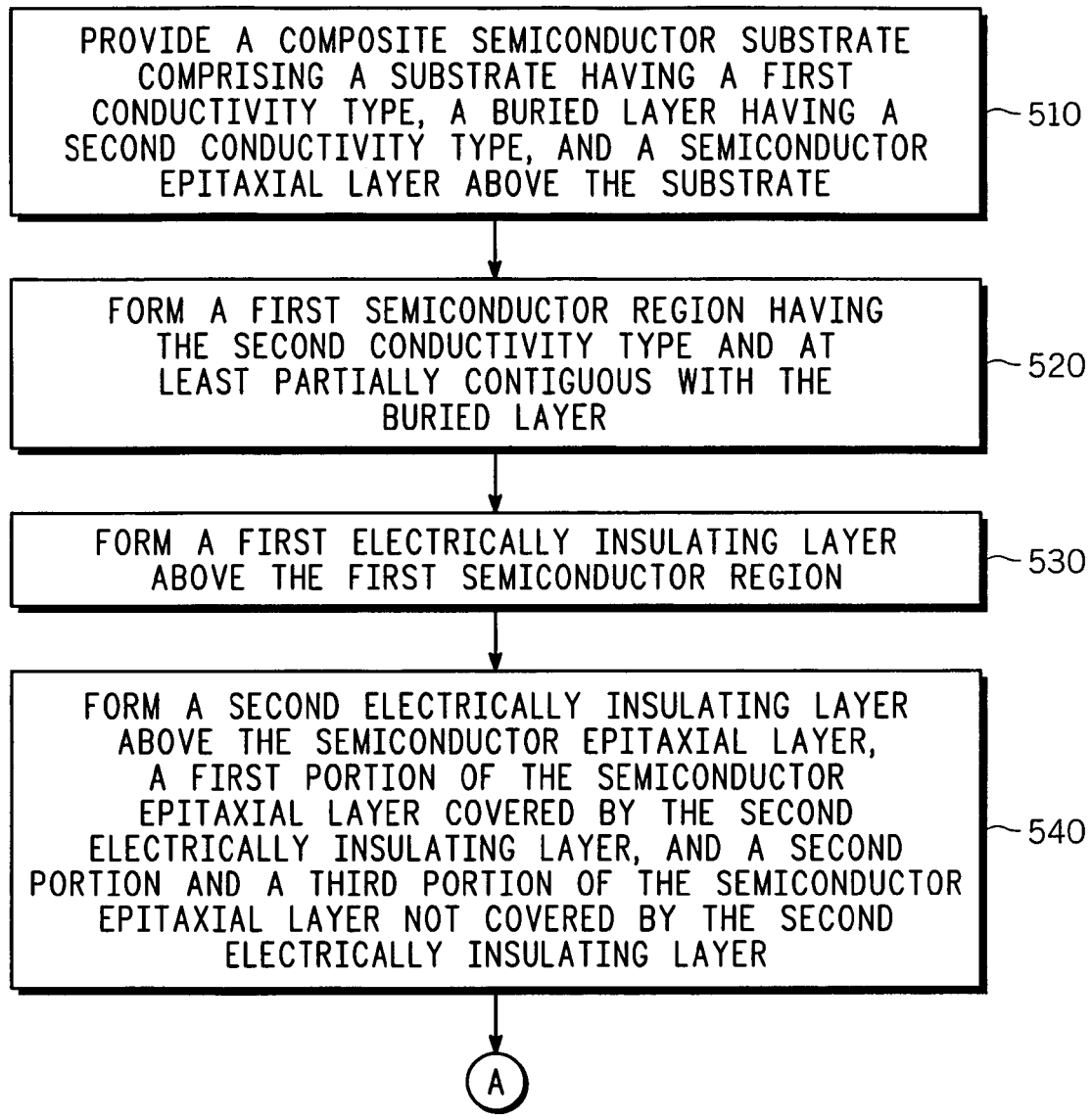
FIG. 5 is a flow chart illustrating a method of manufacturing a semiconductor component according to an embodiment of the invention.

FIG. 5 is a flow chart illustrating a method 500 of manufacturing a semiconductor component according to an embodiment of the invention. Referring now to FIG. 5, a step 510 of method 500 is to provide a composite semiconductor substrate comprising a substrate having a first conductivity type, a buried layer having a second conductivity type, and a semiconductor epitaxial layer above the substrate. As an example, the substrate can be similar to semiconductor region 110 in FIG. 2. As a further example, the buried layer can be similar to semiconductor region 120 in FIG. 2. As a still further example, the semiconductor epitaxial layer can be similar to semiconductor region 135 in FIG. 2.

A step 520 of method 500 is to form a first semiconductor region having the second conductivity type and at least partially contiguous with the buried layer. As an example, the first semiconductor region can be similar to semiconductor region 170 in FIG. 2. A step 530 of method 500 is to form a first electrically insulating layer above the first semiconductor region. As an example, the first electrically insulating layer can be similar to electrically insulating layer 190 in FIGS. 1 and 2.

A step 540 of method 500 is to form a second electrically insulating layer above the semiconductor epitaxial layer, a first portion of the semiconductor epitaxial layer covered by the second electrically insulating layer, and a second portion and a third portion of the semiconductor epitaxial layer not covered by the second electrically insulating layer. As an example, the second electrically insulating layer can be similar to electrically insulating layer 180 in FIGS. 1 and 2, and the second and third portions can be similar to regions 181 and 182, respectively, in FIG. 2. Step 540 is followed by a box A, representing a transition step from method 500 to its continuation described in FIG. 6.

Figure 6:
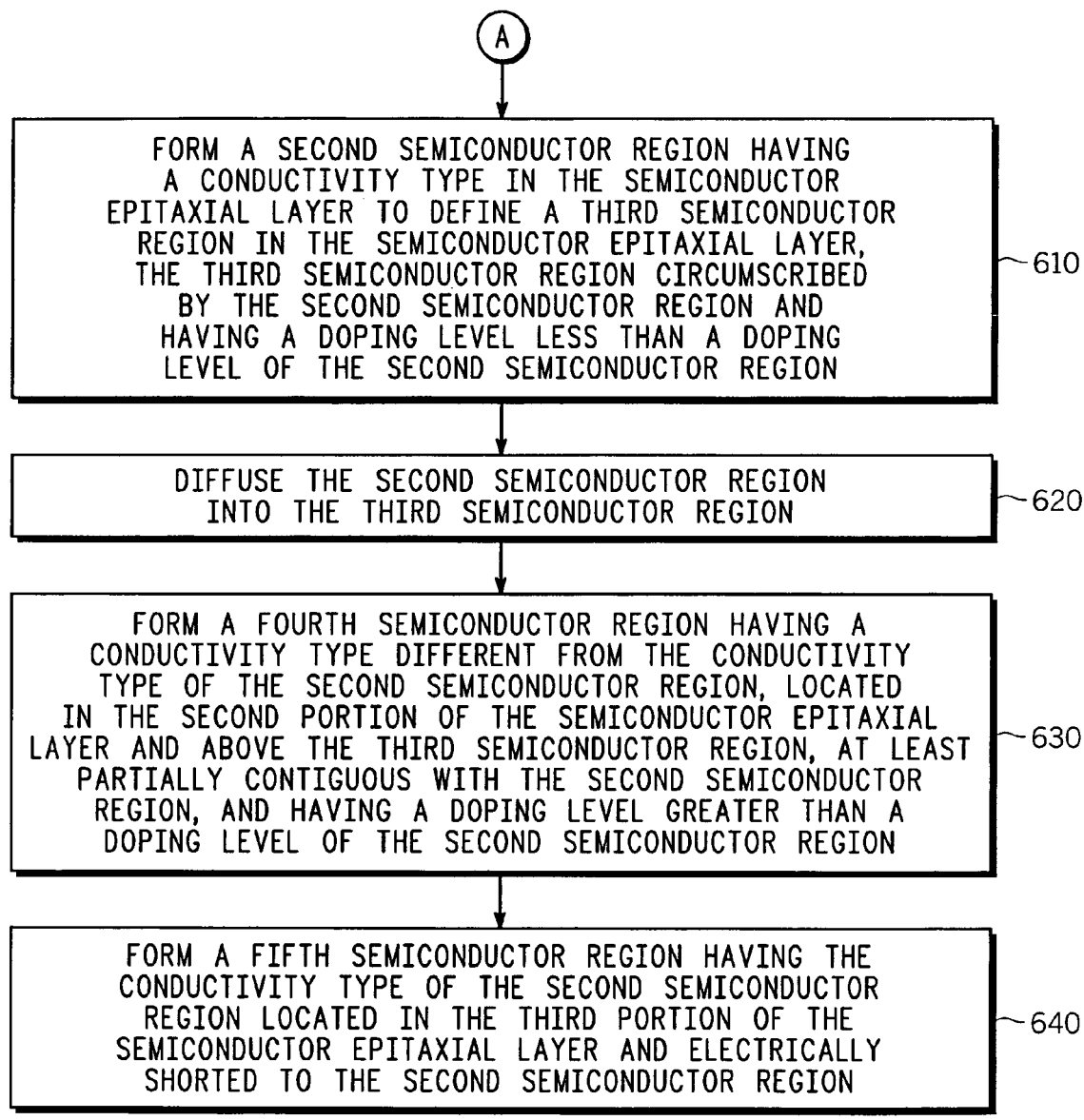
FIG. 6 is a flow chart illustrating a method of manufacturing a semiconductor component according to an embodiment of the invention.

FIG. 6 is a flow chart illustrating a method 600 of manufacturing a semiconductor component according to an embodiment of the invention. Method 600 is a continuation of method 500, described in FIG. 5, and begins at box A in FIG. 6. Box A in FIG. 6 represents the same transition step as that represented by box A in FIG. 5. Referring to FIG. 6, a step 610 of method 600 is to form a second semiconductor region having a conductivity type in the semiconductor epitaxial layer to define a third semiconductor region in the semiconductor epitaxial layer, the third semiconductor region circumscribed by the second semiconductor region and having a doping level less than a doping level of the second semiconductor region. As an example, the second semiconductor region can be similar to semiconductor region 150 in FIGS. 1 and 2. As a further example, the third semiconductor region can be similar to semiconductor region 130 in FIG. 1. In one embodiment, forming the second semiconductor region comprises implanting a dopant into the third portion of the semiconductor epitaxial layer, self-aligned to the first and second electrically insulating layers.

A step 620 of method 600 is to diffuse the second semiconductor region into the third semiconductor region. As has been mentioned earlier herein, in order to reduce damage to a semiconductor component, a dopant forming a particular semiconductor region can be implanted into the third portion of the semiconductor epitaxial layer, and a dopant forming a different semiconductor region can be implanted into the second portion of the semiconductor epitaxial layer. Implanting into the first and second portions as described and not into the first portion helps reduce damage to the crystalline structure of the semiconductor epitaxial layer in the first portion that may occur if each implantation were into the first region. Following the implantation steps, and in order to form a zener diode junction within the semiconductor component, the dopants forming the two semiconductor regions can be diffused, for example by using one or more thermal steps, such that they abut each other. In different embodiments, the particular semiconductor region can be diffused before diffusing the different semiconductor region, or vice versa. In one embodiment, step 620 occurs after step 640.

A step 630 of method 600 is to form a fourth semiconductor region having a conductivity type different from the conductivity type of the second semiconductor region, located in the second portion of the semiconductor epitaxial layer and above the third semiconductor region, at least partially contiguous with the second semiconductor region, and having a doping level greater than a doping level of the second semiconductor region. As an example, the fourth semiconductor region can be similar to semiconductor region 140 in FIGS. 1 and 2. In one embodiment, a junction between the fourth semiconductor region and the second semiconductor region forms a zener diode junction. As an example, the zener diode junction can be similar to zener diode junction 145 in FIG. 2. In one embodiment, forming the fourth semiconductor region comprises implanting a dopant into the second portion of the semiconductor epitaxial layer. In the same or another embodiment, forming the fourth semiconductor region further comprises self-aligning the fourth semiconductor region to the second electrically insulating layer.

A step 640 of method 600 is to form a fifth semiconductor region having the conductivity type of the second semiconductor region located in the third portion of the semiconductor epitaxial layer and electrically shorted to the second semiconductor region. As an example, the fifth semiconductor region can be similar to semiconductor region 160 in FIGS. 1 and 2. In one embodiment, forming the first and second electrically insulating layers occur before forming the second semiconductor region, the fourth semiconductor region, and the fifth semiconductor region. In a different embodiment, forming the second semiconductor region, the fourth semiconductor region, and the fifth semiconductor region occur before forming the first and/or second electrically insulating layers. In a particular embodiment, step 640 comprises self-aligning the fifth semiconductor region between the first and second electrically insulating layers. Steps 620, 630, and 640 can be performed in any sequence with respect to each other.

Figure 7:
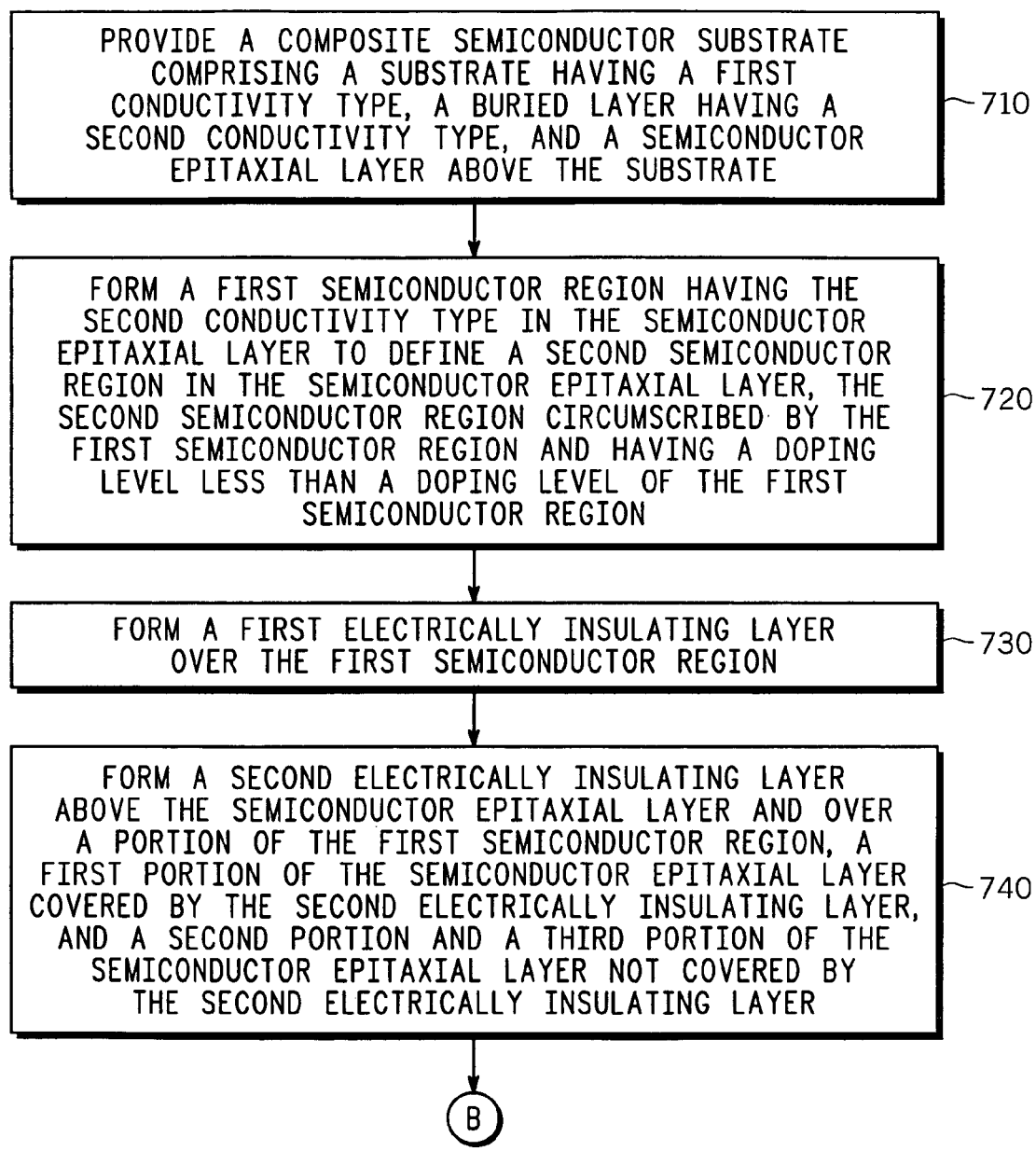
FIG. 7 is a flow chart illustrating a method of manufacturing a semiconductor component according to an embodiment of the invention.

FIG. 7 is a flow chart illustrating a method 700 of manufacturing a semiconductor component according to an embodiment of the invention. Referring now to FIG. 7, a step 710 of method 700 is to provide a composite semiconductor substrate comprising a substrate having a first conductivity type, a buried layer having a second conductivity type, and a semiconductor epitaxial layer above the substrate. As an example, the substrate can be similar to semiconductor region 310 in FIG. 4. As a further example, the buried layer can be similar to semiconductor region 320 in FIG. 4. As a still further example, the semiconductor epitaxial layer can be similar to semiconductor region 335 in FIG. 4.

A step 720 of method 700 is to form a first semiconductor region having the second conductivity type in the semiconductor epitaxial layer to define a second semiconductor region in the semiconductor epitaxial layer, the second semiconductor region circumscribed by the first semiconductor region and having a doping level less than a doping level of the first semiconductor region. As an example, the first semiconductor region can be similar to semiconductor region 350 in FIGS. 3 and 4. As a further example, the second semiconductor region can be similar to semiconductor region 330 in FIGS. 3 and 4. In one embodiment, forming the first semiconductor region comprises implanting a dopant into the third portion of the semiconductor epitaxial layer. Step 740 is followed by a box B, representing a transition step from method 700 to its continuation described in FIG. 8.

A step 730 of method 700 is to form a first electrically insulating layer over the first semiconductor region. As an example, the first electrically insulating layer can be similar to electrically insulating layer 390 in FIG. 4.

A step 740 of method 700 is to form a second electrically insulating layer above the semiconductor epitaxial layer and above a portion of the first semiconductor region, a first portion of the semiconductor epitaxial layer covered by the second electrically insulating layer, and a second portion and a third portion of the semiconductor epitaxial layer not covered by the second electrically insulating layer. As an example, the second electrically insulating layer can be similar to electrically insulating layer 380 in FIG. 4. Furthermore, the second and third portions can be similar to regions 381 and 382, respectively, in FIG. 3.

Figure 8:
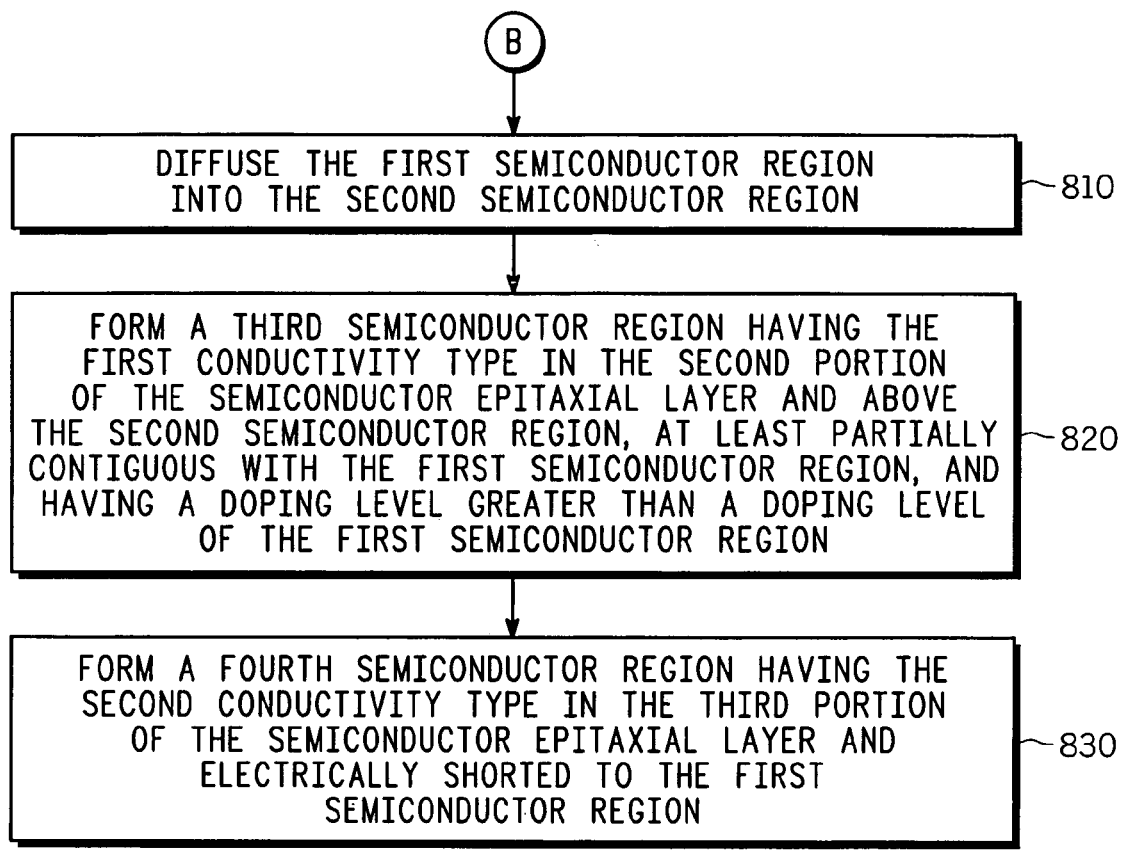
FIG. 8 is a flow chart illustrating a continuation of the method of manufacturing a semiconductor component according to an embodiment of the invention.

FIG. 8 is a flow chart illustrating a method 800 of manufacturing a semiconductor component according to an embodiment of the invention. Method 800 is a continuation of method 700, described in FIG. 7, and begins at box B in FIG. 8. Referring to FIG. 8, a step 810 of method 800 is to diffuse the first semiconductor region into the second semiconductor region. In one embodiment, step 810 occurs after step 830.

A step 820 of method 800 is to form a third semiconductor region having the first conductivity type in the second portion of the semiconductor epitaxial layer and above the second semiconductor region, at least partially contiguous with the first semiconductor region, and having a doping level greater than a doping level of the first semiconductor region. As an example, the third semiconductor region can be similar to semiconductor region 340 in FIG. 4. In one embodiment, a junction between the third semiconductor region and the first semiconductor region forms a zener diode junction. As an example, the zener diode junction can be similar to zener diode junction 345 in FIG. 4. In one embodiment, forming the third semiconductor region comprises implanting a dopant into the second portion of the semiconductor epitaxial layer. In the same or another embodiment, forming the third semiconductor region further comprises self-aligning the third semiconductor region to the second electrically insulating layer.

A step 830 of method 800 is to form a fourth semiconductor region having the second conductivity type in the third portion of the semiconductor epitaxial layer and electrically shorted to the first semiconductor region. As an example, the fourth semiconductor region can be similar to semiconductor region 360 in FIGS. 3 and 4. In one embodiment, forming the second electrically insulating layer occurs before forming the third semiconductor region and the fourth semiconductor region. In a different embodiment, forming the third semiconductor region and the fourth semiconductor region occur before forming the second electrically insulating layer. In a particular embodiment, forming the fourth semiconductor region comprises self-aligning the fourth semiconductor region between the first and second electrically insulating layers. In another embodiment, the sequence of steps 820 and 830 can be reversed.

Although the invention has been described with reference to specific embodiments, it will be understood by those skilled in the art that various changes may be made without departing from the spirit or scope of the invention. Various examples of such changes have been given in the foregoing description. Accordingly, the disclosure of embodiments of the invention is intended to be illustrative of the scope of the invention and is not intended to be limiting. It is intended that the scope of the invention shall be limited only to the extent required by the appended claims. For example, to one of ordinary skill in the art, it will be readily apparent that the semiconductor component discussed herein may be implemented in a variety of embodiments, and that the foregoing discussion of certain of these embodiments does not necessarily represent a complete description of all possible embodiments.

Additionally, benefits, other advantages, and solutions to problems have been described with regard to specific embodiments. The benefits, advantages, solutions to problems, and any element or elements that may cause any benefit, advantage, or solution to occur or become more pronounced, however, are not to be construed as critical, required, or essential features or elements of any or all of the claims.

Moreover, embodiments and limitations disclosed herein are not dedicated to the public under the doctrine of dedication if the embodiments and/or limitations: (1) are not expressly claimed in the claims; and (2) are or are potentially equivalents of express elements and/or limitations in the claims under the doctrine of equivalents.

What is claimed is:

1. A method of manufacturing a semiconductor component, the method comprising:
   providing a composite semiconductor substrate comprising:
      a substrate having a first conductivity type;
      a buried layer having a second conductivity type above the substrate; and
      a semiconductor epitaxial layer above the buried layer;
   forming a first semiconductor region having a conductivity type in the semiconductor epitaxial layer to define a second semiconductor region in the semiconductor epitaxial layer, the second semiconductor region circumscribed by the first semiconductor region and having a doping level less than a doping level of the first semiconductor region;
   forming an electrically insulating layer above the semiconductor epitaxial layer, a first portion of the semiconductor epitaxial layer covered by the electrically insulating layer, and a second portion and a third portion of the semiconductor epitaxial layer not covered by the electrically insulating layer;
   forming a third semiconductor region having a conductivity type different from the conductivity type of the first semiconductor region, located in the second portion of the semiconductor epitaxial layer and above the second semiconductor region, at least partially contiguous with the first semiconductor region, and having a doping level greater than a doping level of the first semiconductor region;
   forming a fourth semiconductor region having the conductivity type of the first semiconductor region located in the third portion of the semiconductor epitaxial layer and electrically shorted to the first semiconductor region; and
   forming a fifth semiconductor region having the second conductivity type, at least partially contiguous with the buried layer, and circumscribing the first semiconductor region, the second semiconductor region, the third semiconductor region, and the fourth semiconductor region,
   wherein:
      a junction between the third semiconductor region and the first semiconductor region forms a zener diode junction; and
      the zener diode junction is located only underneath the electrically insulating layer.

2. The method of claim 1 further comprising:
   forming the first semiconductor region to have a doping level lower than doping levels of the buried layer, the third semiconductor region, the fourth semiconductor region, and the fifth semiconductor region.

3. The method of claim 1 wherein:
   forming the electrically insulating layer occurs before forming the third semiconductor region and the fourth semiconductor region.

4. The method of claim 3 wherein:
forming the third semiconductor region further comprises:
- self-aligning the third semiconductor region to the electrically insulating layer; and forming the fourth semiconductor region further comprises:
- self-aligning the fourth semiconductor region to the electrically insulating layer.

5. The method of claim 1 wherein:
forming the third semiconductor region and the fourth semiconductor region occur before forming the electrically insulating layer.

6. A method of manufacturing a semiconductor component, the method comprising:
providing a composite semiconductor substrate comprising:
- a substrate having a first conductivity type;
- a buried layer having a second conductivity type above the substrate; and
- a semiconductor epitaxial layer above the buried layer;

forming a first semiconductor region having the second conductivity type in the semiconductor epitaxial layer to define a second semiconductor region in the semiconductor epitaxial layer, the second semiconductor region circumscribed by the first semiconductor region and having a doping level less than a doping level of the first semiconductor region, the first semiconductor region contacting the buried layer;

forming an electrically insulating layer above the semiconductor epitaxial layer, a first portion of the semiconductor epitaxial layer covered by the electrically insulating layer, and a second portion and a third portion of the semiconductor epitaxial layer not covered by the electrically insulating layer;

forming a third semiconductor region having the first conductivity type in the second portion of the semiconductor epitaxial layer and above the second semiconductor region, at least partially contiguous with the first semiconductor region, and having a doping level greater than a doping level of the first semiconductor region; and forming a fourth semiconductor region having the second conductivity type in the third portion of the semiconductor epitaxial layer and electrically shorted to the first semiconductor region, wherein:
- a junction between the third semiconductor region and the first semiconductor region forms a zener diode junction; and
- the zener diode junction is located only underneath the electrically insulating layer.

7. The method of claim 6 further comprising:
forming the first semiconductor region to have a doping level lower than doping levels of the buried layer, the third semiconductor region, and the fourth semiconductor region.

8. The method of claim 6 wherein:
forming the electrically insulating layer occurs before forming the third semiconductor region and the fourth semiconductor region.

9. The method of claim 8 wherein:
forming the third semiconductor region further comprises:
- self-aligning the third semiconductor region to the electrically insulating layer; and forming the fourth semiconductor region further comprises:
- self-aligning the fourth semiconductor region to the electrically insulating layer.

10. The method of claim 6 wherein:
forming the third semiconductor region and the fourth semiconductor region occur before forming the electrically insulating layer.

* * * * *